(12) United States Patent
Kawase et al.

(10) Patent No.: US 8,110,534 B2
(45) Date of Patent: Feb. 7, 2012

(54) CLEANING SOLUTION FOR SUBSTRATE FOR SEMICONDUCTOR DEVICE AND PROCESS FOR PRODUCING SUBSTRATE FOR SEMICONDUCTOR DEVICE

(75) Inventors: Yasuhiro Kawase, Kitakyushu (JP); Makoto Ikemoto, Kitakyushu (JP); Atsushi Itou, Kitakyushu (JP); Makoto Ishikawa, Kitakyushu (JP)

(73) Assignee: Mitsubishi Chemical Corporation, Tokyo (JP)

( * ) Notice: Subject to any disclaimer, the term of this patent is extended or adjusted under 35 U.S.C. 154(b) by 19 days.

(21) Appl. No.: 12/600,545

(22) PCT Filed: May 16, 2008

(86) PCT No.: PCT/JP2008/059072
§ 371 (c)(1), (2), (4) Date: Nov. 17, 2009

(87) PCT Pub. No.: WO2008/143187
PCT Pub. Date: Nov. 27, 2008

(65) Prior Publication Data
US 2010/0167972 A1 Jul. 1, 2010

(30) Foreign Application Priority Data

May 18, 2007 (JP) .................. 2007-133083

(51) Int. Cl.
*C11D 1/66* (2006.01)
(52) U.S. Cl. ........................ 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 5,583,265 A * | 12/1996 | Woo et al. ..................... | 568/622 |
| 6,387,874 B1 * | 5/2002 | Schalitz et al. ............... | 510/530 |
| 7,276,109 B2 * | 10/2007 | Stockel et al. .................... | 106/2 |
| 2003/0228763 A1 * | 12/2003 | Schroeder et al. ............ | 438/691 |
| 2005/0118132 A1 * | 6/2005 | Xia et al. ................... | 424/70.31 |
| 2005/0282390 A1 * | 12/2005 | Bian et al. ..................... | 438/692 |
| 2006/0270573 A1 | 11/2006 | Ikemoto et al. | |

FOREIGN PATENT DOCUMENTS

| | | |
|---|---|---|
| JP | 7 216392 | 8/1995 |
| JP | 8 69990 | 3/1996 |
| JP | 8 109397 | 4/1996 |
| JP | 2001 7071 | 1/2001 |
| JP | 2005 260213 | 9/2005 |
| JP | 2006 199939 | 8/2006 |

OTHER PUBLICATIONS

Kern, Werner et al., "Cleaning Solutions Based on Hydrogen Peroxide for use in Silicon Semiconductor Technology", RCA Review, pp. 187-205, Jun. 1970.

* cited by examiner

*Primary Examiner* — Gregory Webb
(74) *Attorney, Agent, or Firm* — Oblon, Spivak, McClelland, Maier & Neustadt, L.L.P.

(57) ABSTRACT

To provide a cleaning solution for a substrate for a semiconductor device which is excellent in the ability to remove particles, organic contaminants, metal contaminants and composite contaminants of an organic matter and a metal attached on a substrate surface, whereby the substrate surface can be highly cleaned, without being corroded. Particularly, to provide a cleaning solution which is excellent in the ability to clean low dielectric constant (Low-k) materials on which liquid is easily repelled due to hydrophobic and of which the ability to remove particles is poor.

A cleaning solution for a substrate for a semiconductor device, which comprises the following components (A) and (B):
(A) an organic acid
(B) a nonionic surfactant having an HLB value of from 5 to less than 13.

12 Claims, No Drawings

CLEANING SOLUTION FOR SUBSTRATE FOR SEMICONDUCTOR DEVICE AND PROCESS FOR PRODUCING SUBSTRATE FOR SEMICONDUCTOR DEVICE

CROSS-REFERENCE TO RELATED APPLICATIONS

This application is a 371 of PCT/JP08/059,072 filed May 16, 2008 and claims the benefit of JP 2007-133083 filed May 18, 2007.

TECHNICAL FIELD

The present invention relates to a cleaning solution for cleaning a surface of a substrate for e.g. semiconductors, glass, metals, ceramics, resins, magnetic materials or superconducting materials wherein metal contaminants or particle contaminants becomes problem, a method for cleaning a surface of a substrate by means of the cleaning solution and a process for producing a substrate for a semiconductor device by means of the cleaning solution. Particularly, the present invention relates to a cleaning solution or the like for effectively cleaning a surface of a substrate for a semiconductor device in production steps of the substrate for a semiconductor device such as a semiconductor element or display device in which a highly clean substrate surface is required.

The cleaning solution of the present invention for a substrate for a semiconductor device is particularly useful for removing fine particles (particles), organic contaminants, metal contaminants and composite contaminants of an organic matter and a metal, which attach on the substrate surface and preventing reattaching without damaging or corroding the substrate surface, whereby the substrate surface is highly cleaned, particularly in a semiconductor material such as silicon, insulating material such as silicon nitride, silicon oxide, glass or a low dielectric constant (Low-k) material or a substrate for a semiconductor device having a transition metal or a transition metal compound on a part of or the entire surface.

BACKGROUND ART

In production of semiconductor devices such as microprocessors, logic LSI, DRAM, flush memories and CCD and flat panel display devices such as TFT liquid crystal, pattern formation and thin film formation are carried out at a level of from submicron to nano-meter order on the surface of a substrate of e.g. silicon, silicon oxide or glass, and it has been an extremely important issue to reduce a very small amount of contaminants on the substrate surface in each step in production. Among such contaminants on the substrate surface, particularly particle contaminants, organic contaminants and metal contaminants decrease electric characteristics and yield of devices, and therefore they have to be reduced as far as possible before the next step is carried out. For removal of the contaminants, cleaning of the substrate surface by means of a cleaning solution is commonly carried out.

In recent years, in the production of devices, further improvement in the throughput and the production efficiency is required. Substrates for producing semiconductor devices tend to be increasingly microsized and highly integrated, and a cleaning method is desired which is capable of highly cleaning the substrate surface quickly and which is not only excellent in the ability to remove metal contaminants and particle contaminants but also the ability to prevent reattaching after cleaning.

It is commonly known that for the removal of particle contaminants, cleaning with an alkaline solution is effective. For cleaning the substrate surface for semiconductor devices such as semiconductor elements or display devices, an aqueous alkaline solution such as an aqueous ammonia solution, an aqueous potassium hydroxide solution or an aqueous tetramethylammonium hydroxide solution, is employed. Further, cleaning (so-called "SC-1 cleaning" or "APM cleaning") with a cleaning agent (so-called "SC-1 cleaning agent" or "APM cleaning agent") comprising ammonia, hydrogen peroxide and water, is also widely employed (Non-Patent Document 1).

However, in the case of the alkaline cleaning solution, etching of a silicon or silicon oxide film on the substrate surface is worried, and it is difficult to sufficiently remove composite contaminants of an organic matter and a metal.

That is why, in recent years, an acidic solution has been proposed wherein a surfactant is added to an acidic solution which is effective to remove metal contaminants on the substrate surface for the purpose of improving the ability to remove particle contaminants.

For example, it has been proposed to clean a silicon wafer by means of a specific surfactant and hydrofluoric acid (Patent Document 1), to clean a silicon wafer by means of a solution wherein a surfactant and ozone are added in an aqueous hydrofluoric acid solution (Patent Document 2) or to remove metal impurity and particle contaminants attached on a substrate having a metal wiring by means of a cleaning solution wherein an organic acid compound is added to a dispersion and/or a surfactant (Patent Document 3).

However, in the case of a solution containing hydrofluoric acid or its salt, in addition to etching of a coexistent thin layer, disposal of waste liquid containing fluorine ions is problematic. Further, in the case of a cleaning solution wherein an organic acid compound is added to a surfactant, it is difficult to wet a substrate surface made of a low dielectric constant (Low-k) material having a strong hydrophobicity, and the ability to remove contaminants on the substrate surface is insufficient.

Patent Document 1: JP-A-7-216392
Patent Document 2: JP-A-8-69990
Patent Document 3: JP-A-2001-7071
Non-Patent Document 1: W. Kern and K. A. Puotinen: RCA Review, p. 187, June (1970)

DISCLOSURE OF THE INVENTION

Problem that the Invention is to Solve

Instead of silicon oxide such as TEOS which has been conventionally used as an interlayer dielectric film and has a high hydrophilicity, a low dielectric constant (Low-k) material with strong hydrophobicity is expected to be introduced to achieve high speed and high integration of LSI devices by introducing a wiring material having a low electric resistance. However, the wiring material having a low electric resistance tends to repel a chemical solution such as a cleaning liquid, and therefore, it is difficult to remove contaminants by cleaning.

A cleaning liquid which is excellent in removing metal contaminants, particle contaminants or composite contaminants of an organic matter and a metal and preventing reattaching even on a hydrofluoric substrate surface such as the low dielectric constant (Low-k) material has not been provided, such being a problem on cleaning a substrate for semiconductor devices.

The present invention has been made to solve the above problem, and it is an object of the present invention to provide a cleaning solution and a cleaning method capable of sufficiently wetting the substrate surface and removing contaminants on the substrate surface without damaging the substrate surface.

Specifically, it is an object of the present invention to provide a cleaning solution and a cleaning method for a substrate for a semiconductor device, which efficiently removes particles, organic contaminants, metal contaminants and composite contaminants of an organic matter and a metal on a substrate surface, prevents reattaching and highly cleans the substrate surface without damaging or corroding it in a substrate for a semiconductor device having a semiconductor material such as silicon, an insulating material such as silicon nitride, silicon oxide, glass or a dielectric constant (Low-k) material, a transition metal or a transition metal compound on a part of or the entire surface. Particularly, it is an object of the present invention to provide a cleaning solution for a substrate for a semiconductor device, which is excellent in the ability to clean a dielectric (Low-k) material which is hydrophobic and can thereby easily repel liquid and of which particle removing property is poor.

Means to Solve the Problem

The present inventors have conducted extensive studies in order to accomplish the above object, and as a result, they have found that the above object can be accomplished by using a solution prepared by combining an organic acid with a specific surfactant as a cleaning solution. Thus, the present invention has been accomplished.

That is, the present invention provides the following.

(1) A cleaning solution for a substrate for a semiconductor device, which comprises the following components (A) and (B):
  (A) an organic acid
  (B) a nonionic surfactant having an HLB value of from 5 to less than 13.

(2) The cleaning solution for a substrate for a semiconductor device according to the above (1), wherein the content of the component (B) is from 0.0005 to 5 wt %.

(3) The cleaning solution for a substrate for a semiconductor device according to the above (1) or (2), which further contains a component (C): a solubilizing agent for the component (B).

(4) The cleaning solution for a substrate for a semiconductor device according to the above (3), wherein the component (C) is a nonionic surfactant having an HLB value of from 13 to 20.

(5) The cleaning solution for a substrate for a semiconductor device according to the above (3) or (4), wherein the relative content (weight ratio) of the component (B) to the component (C) is component (B): component (C)=1:1 to 10:1.

(6) The cleaning solution for a substrate for a semiconductor device according to any one of the above (1) to (5), which further contains a component (D): an anionic surfactant other than the component (C).

(7) The cleaning solution for a substrate for a semiconductor device according to any one of the above (1) to (6), wherein the organic acid (A) is a polycarboxylic acid.

(8) The cleaning solution for a substrate for a semiconductor device according to any one of the above (1) to (7), which has a pH of from 1 to 5.

(9) The cleaning solution for a substrate for a semiconductor device according to any one of the above (1) to (8), which further contains a component (E): a complexing agent.

(10) A method for cleaning a substrate for a semiconductor device, which comprises cleaning a substrate for a semiconductor device by means of the cleaning solution as defined in any one of the above (1) to (9).

(11) A cleaning solution for a substrate for a semiconductor device, which comprises an organic acid and has an etching rate of a wiring material on the substrate for a semiconductor device of at most 0.06 nm/minute and a removing efficiency of particle contaminants of at least 95%.

(12) The cleaning solution for a substrate for a semiconductor device according to the above (11), wherein the wiring material on the substrate for a semiconductor device is cupper.

(13) A method for cleaning a substrate for a semiconductor device, which comprises cleaning a substrate for a semiconductor device which has a wiring material on its surface by means of the solution as defined in the above (11) or (12).

(14) A process for producing a substrate for a semiconductor device, which comprises a step of forming a wiring material layer and chemical mechanical polishing (CMP) its surface and after the CMP, a step of cleaning the wiring material layer by means of a cleaning solution which comprises the following components (A) and (B):
  (A) an organic acid
  (B) a nonionic surfactant having an HLB value of from 5 to less than 13.

Effects of the Invention

According to the present invention, for a substrate for a semiconductor device having a semiconductor material such as silicon, an insulating material such as silicon nitride, silicon oxide, glass or a low dielectric constant (Low-k) material, a transition metal or a transition metal compound on a part of or the entire surface, it is possible to effectively remove fine particles (particles), organic contaminants, metal contaminants and composite contaminants of an organic matter-metal attached on the substrate surface by cleaning. Further, according to the present invention, even if fine particles or the like are present in the system, reattaching can be effectively prevented. Particularly, the wettability of a hydrophobic low dielectric constant (Low-k) material which tends to repel a cleaning solution, can be improved, whereby the cleaning efficiency can be improved. Further, in addition to the cleaning efficiency, since both roughness and low etching property on a surface can be established, the present invention is industrially very useful as a surface treating technique, for example for cleaning to remove contaminants in steps for producing semiconductor devices or display devices.

BEST MODE FOR CARRYING OUT THE INVENTION

Now, an embodiment of the present invention will be described in detail.

The cleaning solution of the present invention for a substrate for a semiconductor device comprises the following components (A) and (B):
  (A) an organic acid
  (B) a nonionic surfactant having an HLB value of from 5 to less than 13.

In the present invention, the HLB (Hydrophile-Lypophile-Balance) value of the surfactant is a value calculated from the formula (the molecular weight of hydrophilic group/the molecular weight of the surfactant)×(100/5) based on the Griffin method. Specifically, attention is paid to the molecular weight of hydrophilic groups in an optional nonionic surfactant, and using the molecular weight as a specific value, the HLB is defined as 20 times of the above molecular weight and represented by the following formula (1).

$$HLB = 20 \times Mw/M = 20 \times (M-Mo)/M = 20 \times (1-Mo/M) \quad (1)$$

(where M is the molecular weight of the nonionic surfactant, and Mw and Mo are the molecular weight of hydrophilic group and the molecular weight of hydrophobic group respectively. Its detail is described in "New edition, Surfactant handbook", third edition, Kogakutosho Ltd., 1996, p. 234).

The cleaning solution of the present invention is characterized by (B) a nonionic surfactant having an HLB value of from 5 to less than 13 (which may hereinafter, sometimes be referred to as surfactant (B)) among the above two components.

In the case of a conventional device substrate having a hydrophilic interlayer insulating film, by using an anionic surfactant and/or a nonionic surfactant having an HLB value of from 13 to 20, the ability to remove particle contaminants, prevent reattaching, etc. can be realized by an excellent surface activity. However, in a case where a cleaning solution containing such a surfactant is used to a next generation device substrate having a low dielectric constant (Low-k) material which is strongly hydrophobic as an interlayer insulating film, the cleaning solution is repelled by the substrate, whereby no adequate wettability can be obtained, and metal contaminants, and particle contaminants, composite contaminants of an organic matter and a metal or the like on the substrate surface cannot be removed enough.

On the other hand, it has been considered that the surfactant (B) cannot be used as a cleaning solution for device substrates, since it is difficult to dissolve the surfactant (B) in an organic acid solution.

However, when a cleaning solution containing the components (A) and (B) is used, it has been surprisingly found that the sufficient wettability can be obtained on the low dielectric constant (Low-k) material which is strongly hydrophobic, particles, organic contaminants, metal contaminants and composite contaminants of an organic matter and a metal which attach on the substrate surface can be efficiently cleaned and removed, while reattaching can be prevented, and the substrate can be highly cleaned without damaging or corroding the substrate surface.

Cleaning Solution for Substrate for Semiconductor Device
(A) Organic Acid

The organic acid to be used in the present invention is not particularly restricted, but an organic carboxylic acid and/or an organic sulfonic acid is preferred from the viewpoint of the solubility and the stability of compounds.

The organic carboxylic acid is not particularly restricted, so long as it has one or at least two carboxylic groups, and it may have a functional group other than the carboxylic group, so long as the effect of the present invention is not impaired.

The organic carboxylic acid may, for example, be an organic carboxylic acid having one carboxylic group such as formic acid, acetic acid, propionic acid, butylic acid, isobutylic acid, maleic acid, ethylmethyl acetic acid, trimethyl acetic acid or heptanoic acid and an organic polycarboxylic acid having at least two carboxy groups such as oxalic acid, succinic acid, maronic acid, maleic acid, fumaric acid, citric acid, itaconic acid, glutaric acid, dimethyl maronic acid, citraconic acid, tartaric acid, malic acid, or adipic acid. From the viewpoint of high solubility and high solving stability in the cleaning solution, an aliphatic polycarboxylic acid is preferred, and among them, a C2-10 aliphatic polycarboxylic acid is preferred. Particularly preferably, oxalic acid, maronic acid, succinic acid, tartaric acid, glutaric acid, malic acid, adipic acid and citric acid may be mentioned. Most preferably, maronic acid, tartaric acid, citric acid, etc. may be mentioned.

Further, as a typical organic sulfonic acid, an aliphatic sulfonic acid such as methane sulfonic acid, ethane sulfonic acid, n-propane sulfonic acid, i-propane sulfonic acid or n-butane sulfonic acid or an aromatic sulfonic acid such as phenyl sulfonic acid may be mentioned. Among them, from the viewpoint of the water solubility, an alkyl sulfonic acid such as methane sulfonic acid or ethane sulfonic acid may preferably be mentioned, and methane sulfonic acid may more preferably be mentioned.

These organic acids may be used alone, or two or more of them may be used in combination in an optional proportion.

The concentration of the organic acid (A) in the cleaning solution of the present invention may be selected depending on objects, however, in order to secure the cleaning property, it is usually at least 0.01 wt %, preferably at least 0.05 wt %, more preferably at least 0.1 wt %, per the total of the cleaning solution, and in order to stabilize the solubility in the cleaning solution, it is usually at most 30 wt %, preferably at most 25 wt %, more preferably at most 20 wt %, per the total of the cleaning solution.

Further, these organic acids may be contained in the form of a salt with a cation in the cleaning solution. In such a case, the cation is not particularly restricted, and ammonium ion, primary, secondary, tertiary or quaternary alkylammonium ion, an alkali metal ion, a phosphonium ion or a sulfonium ion may be used. Among them, since the influence of dispersion and residual on a substrate metal for example residual of metal ions on the substrate surface, is little, an ammonium ion or an alkylammonium ion is preferred, and among them, an alkylammonium ion is most preferred. An alkyl group of the alkylammonium ion is optionally selected depending on the solubility in the cleaning solution, and it is usually a $C_{1-4}$ alkyl group.

(B) Nonionic Surfactant Having HLB Value of from 5 to Less than 13

The surfactant (B) contained in the cleaning solution of the present invention is not particularly restricted, so long as it is a nonionic surfactant having an HLB value of from 5 to less than 13 from the viewpoint of the permeability and low foamability. Since the biodegradation of the surfactant (B) is excellent, an alkylene oxide nonionic surfactant is preferred, an alkylene oxide type nonionic surfactant having a hydrocarbon group which may have a substituent (except a phenyl group) and a polyoxyalkylene group in the same molecule structure is preferred, and among them, the surfactant (B) is particularly preferably a polyoxyalkylene ether represented by the following formula (I) from the viewpoint of the ability to remove particle contaminants or the property of preventing reattaching (hereinafter, the alkylene oxide type nonionic surfactant represented by the following formula (I) may sometimes be referred to as "surfactant (I)").

The lower limit of the HLB value of the surfactant (B) is 5, preferably 8. Further, the HLB value is less than 13, preferably at most 12, further preferably at most 11.

$$R^1-O-(AO)_b-X \quad (I)$$

(provided that, $R^1$ is a hydrocarbon group which may have a substituent (except a phenyl group), and AO is an alkylene oxide. The carbon number (a) contained in the hydrocarbon group $R^1$ and the number of the oxyalkylene group (b) in the polyoxyalkylene group $(AO)_b$ are usually $a \leq 15$, $b \leq 7$ and an integer which satisfies $1.5 \leq a/b \leq 7$. X is a hydrogen atom, a $C_{1-4}$ alkyl group which may have a substituent or an acyl group).

Among the polyoxyalkylene alkyl ether of the surfactant (I), a polyoxyalkylene ether wherein AO is an ethylene oxide or a propylene oxide is preferred, and a polyoxyethyl alkyl ether wherein AO is ethylene oxide is particularly preferred.

In the alkylene oxide type nonionic surfactant such as the surfactant (I), the ratio (a/b) of the number of carbons contained in the hydrocarbon group $R^1$ (a) to the number of the oxyalkylene group such as a polyoxyethylene group (b) (hereinafter may sometimes be referred to as a/b ratio) is usually at least 1.5, preferably at least 2.0 and usually at most 7, preferably at most 4. When the a/b ratio is at least the above lower limit, the wettability of the cleaning solution on a substrate which is highly hydrophobic and the ability to remove particles, organic contaminants, metal contaminants and composite contaminants of an organic matter and metal are preferred. Further, when the a/b ratio is at most the above upper limit, the surfactant (B) is prevented from being fine oil droplets and precipitating, whereby white turbidity can be prevented, and problems such as deterioration of the cleaning property and residual oil droplets tend not to occur.

Further, the number of carbon contained in the hydrocarbon group $R^1$ (a) is usually at most 15, preferably at most 14, further preferably at most 13. Further, (a) is usually at least 8. Further, in a case where the main chain has a hydrocarbon group as a substituents, (a) is the total number of carbons in the hydrocarbon group as the main chain and carbons in the hydrocarbon as the substituent. When (a) is at least the above lower limit, the wettability on hydrophobic substrates is preferably improved, and when (a) is at most the above upper limit, the deterioration of the solubility in water is preferably little, and the load to dispose a waste liquid is preferably low.

The hydrocarbon group R1 may, for example, be a saturated alkyl group such as a nonyl group, a decyl group, a undecyl group, a lauryl group, a tridecyl group or a tetradecyl group, and such a hydrocarbon group may have a substituent such as a hydroxy group, an ether group, a halogeno group, an ester group, a nitro group or an amide group.

Further, the number of oxyalkylene groups in the polyoxyalkylene group (b) is usually at most 7, preferably at most 6, more preferably at most 5, and usually at least 2. When (b) is at most the above upper limit, the wettability of a cleaning solution on hydrophobic substrates is preferred. Further, when (b) is at least 2, the solubility or the stability of the surfactant (b) in a cleaning solution is preferred.

As the surfactant (I), as specific examples of a preferred surfactant (B) in the present invention, a polyoxyethylene (b=4) nonyl ether, a polyoxyethylene (b=4) decyl ether, a polyoxyethylene (b=4) undecyl ether, a polyoxyethylene (b=4) lauryl ether, a polyoxyethylene (b=5) lauryl ether, a polyoxyethylene (b=4) tridecyl ether, a polyoxyethylene (b=5) tridecyl ether, a polyoxyethylene (b=5) tetradecyl ether or a polyoxyethylene (b=6) pentadecyl ether may be mentioned.

In the present invention, plural surfactants (I) of which (a), (b), another substituent or the like varies may be used in combination at an optional ratio within the range of the present invention.

Further, when plural surfactants (I) are used in combination, so long as the average value of the a/b ratio of the total surfactants (I), the carbon number (a) and the number of oxyalkylene groups (b) are within the above preferred ranges, the a/b ratio, (a) or (b) of each surfactant (I) may be out of the above preferred ranges.

The lower limit of the content of the surfactant (B) in the cleaning solution of the present invention is usually 0.001 wt %, preferably 0.003 wt %, further preferably 0.01 wt % per the cleaning solution, and the upper limit of the content is usually 5 wt %, preferably 1.0 wt %, further preferably 0.5 wt %. When the concentration of the surfactant (B) in the cleaning solution is at least the above lower limit, the effect to improve the wettability of the cleaning solution on hydrophilic substrates is preferred, and when the concentration is at most the above upper limit, the load to biodegrade a waste liquid tends not to increase too much.

The surfactant (B) may be dissolved in the cleaning solution of the present invention by a physical method such as stirring or temperature rise or may be chemically dissolved by using a component to dissolve the surfactant (B). From the viewpoint of stability and handling efficiency of the cleaning solution, the cleaning solution of the present invention preferably further contains a surfactant (C) (solubilizing agent for the surfactant (B)).

Surfactant (C)

The cleaning solution of the present invention is usually liquid at the time of cleaning. The liquid state may be confirmed by visual observation.

The surfactant (C) contained in the cleaning solution of the present invention is not particularly restricted, so long as the solubility of the surfactant (B) in the organic acid solvent is improved. From the viewpoint of the biodegradation, the surfactant (C) is preferably an anionic surfactant or a nonionic surfactant, and from the viewpoint of the effect to improve solubility, the nonionic surfactant is further preferred. In a case where the surfactant (C) is the nonionic surfactant, the HLB value is preferably from 13 to 20 from the viewpoint of the cleaning property, dispersability and low foamability. Further, among nonionic surfactants, from the viewpoint of the stability in an acidic cleaning solution, an alkylene oxide type is preferred, and a nonionic surfactant having a hydrocarbon group which may have a substituent (except a phenyl group from the viewpoint of environmental influence) and a polyoxyalkylene group in the same molecule structure is particularly preferred. From the viewpoint of the ability to remove particle contaminants or prevent reattaching, the surfactant (C) is preferably a polyoxyalkylene ether represented by the following formula (II) (hereinafter, the alkylene oxide type nonionic surfactant represented by the following formula (II) may sometimes be referred to as "surfactant (II)").

The lower limit of the HLB value of the surfactant (C) is usually 13, preferably 14, and the upper limit of the HLB value is usually 20, preferably 18, more preferably 16.

$$R^2-O-(BO)_d-Y \qquad (II)$$

(provided that, $R^2$ is a hydrocarbon group which may have a substituent (except a phenyl group), and BO is an alkylene oxide. The carbon number (c) contained in the hydrocarbon group $R^2$ and the number of the oxyalkylene groups (d) in the polyoxyalkylene group $(BO)_d$ are usually $9 \leq c$ and $8 \leq d$ and integers which satisfies $1.0 \leq c/d \leq 1.6$ respectively. Y is a hydrogen atom, a $C_{1-4}$ alkyl group which may have a substituent or an acyl group).

Among the polyoxyalkylene alkyl ether of the surfactant (II), a polyoxyalkylene ether wherein BO is an ethylene oxide or a propylene oxide is preferred, and a polyoxyethylene alkyl ether wherein BO is ethylene oxide is particularly preferred.

In the alkylene oxide type nonionic surfactant such as the surfactant (II), the ratio (c/d) of the number of carbons contained in the hydrocarbon group $R^2$ (c) to the number of the oxyalkylene group such as a polyoxyethylene group (d) (hereinafter may sometimes be referred to as c/d ratio) is usually at least 1.0 and at most 1.6, preferably at least 1.0 and at most 1.4. When the c/d ratio is at least the above lower limit, the ability to remove particles or to prevent reattaching is preferred, the solubility in water can be secured, and the load to dispose a waste liquid is low. Further, when the c/d ratio is at most the above upper limit, the surfactant (C) is prevented from being fine oil droplets and precipitating, whereby white turbidity can be prevented, and problems such as deterioration of the cleaning property and residual oil droplets tend not occur.

Further, the number of carbon (c) contained in the hydrocarbon group $R^2$ is usually at least 9, preferably at least 10. Further, the number of carbon (c) is usually less than 16, preferably at most 14. Further, in a case where the main chain has a hydrocarbon group as a substituents, (c) is the total number of carbons in the hydrocarbon group as the main chain and carbons in the hydrocarbon as the substituent. When (c) is at least the above lower limit, the ability to remove particles is preferred, and when (c) is at most the above upper limit, the deterioration of the solubility in water is preferably little, and the load to dispose a waste liquid is preferably low.

The hydrocarbon group R2 may, for example, be a saturated alkyl group such as a nonyl group, a decyl group, an undecyl group, a lauryl group, a tridecyl group or a tetradecyl group, and such a hydrocarbon group may have a substituent such as a hydroxy group, an ether group, a halogeno group, an ester group, a nitro group or an amide group.

Further, the number of oxyalkylene groups (d) in the polyoxyalkylene group is at least 8, more preferably at least 8 and at most 16, further preferably at least 8 and at most 14. When (d) is at most the above upper limit, the ability to remove particles is preferred, and when (d) is at least the above lower limit, the load to dispose a waste liquid is low, and the decomposition of the surfactant (C) in the cleaning solution tends not to occur.

As the surfactant (C), as specific example of the preferred surfactant (II) of the present invention, a polyoxyethylene (d=8) nonyl ether, a polyoxyethylene (d=9) decyl ether, a polyoxyethylene (d=11) undecyl ether, a polyoxyethylene (d=10) lauryl ether, a polyoxyethylene (d=11) lauryl ether, a polyoxyethylene (d=10) tridecyl ether, a polyoxyethylene (d=12) tridecyl ether, a polyoxyethylene (d=11) tetradecyl ether, a polyoxyethylene (d=13) tetradecyl ether, a polyoxyethylene (d=12) pentadecyl ether, a polyoxyethylene (d=14) pentadecyl ether, a polyoxyethylene (d=12) cetyl ether or a polyoxyethylene (d=15) cetyl ether may be mentioned.

In the present invention, within the above preferred ranges, plural surfactants (II) of which (c), (d), another substituent or the like varies may be used in combination at a optional ratio.

Further, in a case where plural surfactants (II) are used, so long as the average of the c/d ratio of the total surfactants (II) is usually at least 1.0 and at most 1.6, the average of the carbon number (c) is at least 9, and the average of the number of oxyalkylene groups (d) is at least 8, the c/d ratio may be less than 1.0 or exceed 1.6, (c) may be less than 9, or (d) may be less than 8 in each surfactant (II).

The lower limit of the content of the surfactant (C) in the cleaning solution of the present invention is usually 0.0001 wt %, preferably 0.0003%, further preferably 0.001 wt %, particularly preferably 0.005 wt % per the cleaning solution, and the upper limit of the content is usually 4 wt %, preferably 3 wt %, more preferably 2 wt %, further preferably 0.5 wt %, particularly preferably 0.1 wt %, most preferably 0.05 wt %. When the concentration of the surfactant (C) in the cleaning solution is at least the above lower limit, the solubility of the surfactant (B) and the ability to remove particles are preferred, and when the concentration is at most the above upper limit, foams tend not to form, and the load to treat biodegradation of a waste liquid tends not to increase.

Concentration of Metal Impurities in Surfactants (B) and (C)

Surfactants may contain metal impurities such as Na, K or Fe or anion components such as halogen ions at a level of from 1 to several thousand wt ppm in some cases in the form usually sold. Accordingly, a surfactant to be used may be a source of metal contaminants or other contaminants.

Therefore, in the surfactants (B) and (C) used in the present invention, the content of preliminary contained impurities, particularly the respective contents of Na, Mg, Al, K, Ca, Fe, Cu, Pb and Zn are reduced to at most 10 wt ppm, preferably at most 3 wt ppm, particularly preferably at most 1 wt ppm.

In order to obtain such a purified surfactant, for example, a surfactant is purified by dissolving in water, followed by passing the solution through an ion-exchange resin to trap ionic impurities on the resin.

Further, in a case where in addition to the surfactants (B) and (C), another surfactant such as the after-mentioned (D) an anionic surfactant is further contained, the content of impurities such as Na, Mg, Al, K, Ca, Fe, Cu, Pb or Zn in such a surfactant is also limited as mentioned above. Thus, among the metal impurities in the cleaning solution, the respective contents of Na, Mg, Al, K, Ca, Fe, Cu, Pb and Zn in the cleaning solution of the present invention are at most 20 ppb, especially at most 5 ppb, particularly at most 0.1 ppb, whereby metal contaminants of substrates for semiconductor devices at the time of cleaning can be preferably prevented. Particularly, in the cleaning solution of the present invention, the total contents of these metal impurities is preferably at most 20 ppb, especially at most 5 ppb, particularly preferably at most 0.1 ppb.

pH

The cleaning solution of the present invention is preferably an acidic cleaning solution having a pH of from 1 to 5, and the cleaning solution particularly preferably has a pH of at least 2. Further, the upper limit of the pH of the cleaning solution of the present invention is preferably 4. When the pH of the cleaning solution is at most the above upper limit, a transition metal or a transition metal compound which is exposure to a substrate surface tend not to erode a part of or the entire surface. When the pH is at least the above lower limit, the object of the present invention to remove contaminants or the effect to prevent reattaching is preferred. Accordingly, in (A) organic acid or the after-mentioned other components in the cleaning solution of the present invention, the concentration of the component which influences on pH is appropriately adjusted within the range of the preferred content so that pH of the cleaning solution becomes such a preferred pH.

Preferred Proportion of the Components (A) to (C)

In order to obtain the sufficient effect of the present invention by the cleaning solution of the present invention, the relative content ratio of the components (A) to (C) is preferably within the following range.

That is, the lower limit of the organic acid (A) is preferably 1 time by weight, more preferably 3 times by weight, to the total content of the surfactant (B) and the surfactant (C), and the upper limit is preferably 20 times by weight, more preferably 10 times by weight to the above total content.

Further, the relative ratio (weight ratio) of the surfactant (B) and the surfactant (C), namely surfactant (B):surfactant (C) is preferably at least 1:1, more preferably at least 2:1 and preferably at most 10:1, more preferably at most 5:1.

When the amount of the surfactant (C) to the surfactant (B) is at least the above lower limit, the surfactant (B) stably dissolves in the cleaning solution, such being preferable.

When the amount of the surfactant (C) to the surfactant (B) is at most the above upper limit, the effect obtained by using the surfactant (B) is sufficiently realized in the present invention.

Further, the average value of HLB values of plural surfactants is calculated by dividing the total product of weight of the surfactant and the HLB values of the surfactant by the total weights of the surfactants. That is, for example, in a case where $M_A$ wt % of a surfactant of which HLB value is $H_A$ and $M_B$ wt % of a surfactant of which HLB value is $H_B$ are used, the average of these HLB values is calculated by $(H_A \times M_A + H_B \times M_B)/(M_A \times M_B)$.

(D) Anionic Surfactant

The cleaning solution of the present invention may further contain anionic surfactant (D) (except the component (C)) in order to improve the ability to remove fine particles.

The anionic surfactant (D) is usually water soluble. As the anionic surfactant (D), one, two or more of an α olefin sulfonic acid, an alkyl sulfonic acid, an alkylbenzene sulfonic acid, an alkyl sulfate, an alkyl ether sulfate, a methyl tauronic acid, a sulfosuccinic acid, an ether sulfonic acid or a salt thereof may be used. Among them, from the viewpoint of the stability of the surfactant and the ability to remove particles such as fine particles at the time of adding in the cleaning solution, the alkylbenzene sulfonic acid, the methyl tauronic acid, the sulfosuccinic acid and a salt thereof are preferred.

The content of the water soluble anionic surfactant (D) in the cleaning solution of the present invention is usually at least 0.0001 wt %, preferably at least 0.0003 wt %, further preferably at least 0.001 wt % and usually at most 0.5 wt %, preferably at most 0.1 wt %, further preferably at most 0.05 wt % per the cleaning solution. When the concentration of the anionic surfactant is at least the above lower limit, the effect of the cleaning solution obtained by adding such an anionic surfactant to remove particles on hydrophobic substrates is preferred. When the concentration of the anionic surfactant is at most the above upper limit, the load to biologically degradade a waste liquid will not increase too much.

(E) Complexing Agent

When the cleaning solution of the present invention further contains a complexing agent (E), metal contaminants on the substrate surface is further reduced, and an extremely cleaned surface can be obtained.

As the complexing agent (E) used in the present invention, known one may optionally be used. Comprehensively considering the contaminants level of the substrate surface, the type of the metal, the cleanness level required for the substrate surface, the cost of the complexing agent, chemical stability, etc, the type of the complexing agent may be selected. The complexing agent (E) used for the cleaning solution of the present invention may, for example, be the following agents.

(1) A compound having nitrogen as a donor atom and a carboxyl group and/or a phosphonic acid group: for example, an amino acid such as glycine; a nitrogen-containing carboxylic acid such as iminodiacetic acid, nitrilotriacetic acid, ethylenediaminetetraacetic acid (EDTA), trans-1,2-diaminocyclohexane tetraacetic acid (CyDTA), diethylenetriaminepentaacetic acid (DTPA) or triethylenetetraminehexaacetic acid (TTHA); or a nitrogen-containing phosphonic acid such as ethylenediaminetetrakis(methylenephosphonic acid) (EDTPO), nitrilotris(methylenephosphonic acid) (NTPO) or propylenediaminetetra(methylenephosphonic acid) (PDTMP) may be mentioned.

(2) A compound having an aromatic hydrocarbon ring and having at least two OH groups and/or O— groups directly bonded to a carbon atom constituting the aromatic hydrocarbon ring: for example, a phenol such as catechol, resorcinol or tiron or a derivative thereof, may be mentioned.

(3) A compound having both the above structures (1) and (2): for example, the following (3-1) and (3-2) may be mentioned.

(3-1) Ethylenediamine di-o-hydroxyphenylacetic acid (EDDHA) or its derivative: for example, an aromatic nitrogen-containing carboxylic acid such as ethylenediamine di-o-hydroxyphenylacetic acid (EDDHA), ethylenediamine-N,N'-bis[(2-hydroxy-5-methylphenyl)acetic acid (EDDHMA), ethylenediamine-N,N'-bis[(2-hydroxy-5-chlorophenyl)acetic acid) (EDDHCA) or ethylenediamine-N,N'-bis[(2-hydroxy-5-sulfophenyl)acetic acid] (EDDHSA); or an aromatic nitrogen-containing phosphonic acid such as ethylenediamine-N,N'-bis[(2-hydroxy-5-methylphenyl)phosphonic acid] or ethylenediamine-N,N'-bis[(2-hydroxy-5-phosphophenyl)phosphonic acid] may be mentioned.

(3-2) N,N'-bis(2-hydroxybenzyl)ethylenediamine-N,N'-diacetic acid (HBED) or its derivative: for example, N,N'-bis(2-hydroxybenzyl)ethylenediamine-N,N'-diacetic acid (HBED), N,N'-bis(2-hydroxy-5-methylbenzyl)ethylenediamine-N,N'-diacetic acid (HMBED) or N,N'-bis(2-hydroxy-5-chlorobenzyl)ethylenediamine-N,N'-diacetic acid may be mentioned.

(4) Others: for example, an amine such as ethylenediamine, 8-quinolinol or o-phenanthroline; a carboxylic acid such as formic acid or acetic acid; a hydrogen halide such as hydrofluoric acid, hydrochloric acid, hydrogen bromide or hydrogen iodide, or a salt thereof; or an oxo acid such as phosphoric acid or condensed phosphoric acid, or a salt thereof, may be mentioned.

The above complexing agent may be used as an acid form or a salt form such as an ammonium salt.

Among the above-described complexing agents, from the viewpoint of cleaning effect, chemical stability, etc., preferred is an amino acid such as glycine; a nitrogen-containing carboxylic acid such as ethylenediaminetetraacetic acid (EDTA) or diethylenetriaminepentaacetic acid (DTPA); a nitrogen-containing phosphonic acid such as ethylenediaminetetrakis(methylenephosphonic acid) (EDTPO) or propylenediaminetetra(methylenephosphonic acid) (PDTMP); ethylenediamine di-o-hydroxyphenylacetic acid (EDDHA) or its derivative; N,N'-bis(2-hydroxybenzyl)ethylenediamine-N,N'-diacetic acid (HBED), or the like.

Among them, in view of the cleaning effect, preferred is ethylenediamine di-o-hydroxyphenylacetic acid (EDDHA), ethylenediamine-N,N'-bis[(2-hydroxy-5-methylphenyl)acetic acid] (EDDHMA), diethylenetriaminepentaacetic acid (DTPA), ethylenediaminetetraacetic acid (EDTA) or propylenediaminetetra(methylenephosphonic acid) (PDTMP).

The above complexing agents may be used alone or in combination of two or more of them in an optional proportion.

The concentration of the complexing agent (E) in the cleaning solution of the present invention may optionally be selected depending upon the type and the amount of contaminant metal impurities and the cleanness level required for the substrate surface, however, generally it is usually at least 1 ppm by weight, preferably at least 5 ppm by weight, more preferably at least 10 ppm by weight and usually at most 10,000 ppm by weight, preferably at most 1,000 ppm by weight, more preferably at most 200 ppm by weight. When the concentration of the complexing agent (E) is at least the above lower limit, the effect to remove contaminants and to prevent reattaching by the complexing agent are preferred. On the other hand, when the concentration of the complexing agent (E) is at most the above upper limit, economical advantage can be obtained, and the complexing agent can be prevented from attaching on the substrate surface and remaining after the surface treatment.

Here, the complexing agent usually contains metal impurities such as Fe at a level of from 1 to several thousand ppm by weight in the form of a commercial agent, and the complexing agent used may be a metal contaminants source in some cases. These metal impurities are present in the form of a stable complex formed with the complexing agent in the initial stages, but as the complexing agent decomposes during long-term use as the cleaning solution, the metal impurities are liberated from the complexing agent and adheres to the substrate surface to be cleaned. Accordingly, it is preferred to preliminarily purify the complexing agent to be used in the present invention before use, and it is preferred to reduce by the purification the contents of the preliminarily contained metal impurities such as Fe, Al and Zn to preferably at most 5 ppm by weight, particularly preferably at most 2 ppm by weight. The purification is may be carried out, for example, by a method of dissolving the complexing agent in an acidic or alkaline solution, subjecting the solution to filtration to separate and remove insoluble impurities, followed by neutralization to precipitate crystals, and separating the crystals from the liquid.

Other Components

The cleaning solution of the present invention may contain other components in an optional proportion within a range not to impair its performance. Such other components may, for example, be an anticorrosive such as a sulfur-containing organic compound (e.g. 2-mercaptothiazoline, 2-mercaptoimidazoline, 2-mercaptoethanol or thioglycerol), a nitrogen-containing organic compound (e.g. benzotriazole, 3-aminotriazole, $N(R)_3$ (wherein R are $C_{1-4}$ alkyl groups), $N(ROH)_3$ (wherein R are $C_{1-4}$ alkyl groups), urea or thiourea), a water soluble polymer (e.g. polyethylene glycol or polyvinyl alcohol) or an alkyl alcohol type compound (ROH (wherein $R^3$ is a $C_{1-4}$ alkyl group)), or an etching accelerator with which an effect of removing a polymer or the like strongly attached after dry etching can be expected, for example, an acid such as sulfuric acid or hydrochloric acid, a reducing agent such as hydrazine, a dissolved gas such as hydrogen, argon or nitrogen or hydrofluoric acid, ammonium fluoride or BHF (buffered hydrofluoric acid).

As such other components to be contained in the cleaning solution of the present invention, an oxidizing agent such as hydrogen peroxide, ozone or oxygen may also be mentioned. In a case where the surface of a silicon (bare silicon) substrate with no oxide film is to be cleaned in a step of cleaning the substrate for a semiconductor device, surface roughening by etching on the substrate surface can be suppressed by incorporating an oxidizing agent. When an oxidizing agent such as hydrogen peroxide is to be incorporated to the cleaning solution of the present invention, it is usually employed so that the concentration of hydrogen peroxide in the cleaning solution will be usually at least 0.001 wt %, particularly at least 0.01 wt % and usually at most 5 wt %, particularly at most 1 wt %.

In a case where the cleaning solution of the present invention contains other components other than the components (A) to (E), the total amount of such other components is usually at most 10 wt %, preferably at most 5 wt %, more preferably at most 1 wt %.

Solvent for Cleaning Solution

The main solvent for the cleaning solution of the present invention is preferably liquid having a relative dielectric constant of from 50 to 90. Specifically, as the main solvent for the cleaning solution of the present invention, water is preferred. As such water, in order to obtain a particularly clean substrate surface, deionized water, preferably ultrapure water, is usually employed. Further, electrolyzed water obtained by electrolysis of water, or hydrogenated water having hydrogen gas dissolved in water may be used.

Preparation Method

The cleaning solution of the present invention is prepared by a conventional method.

Among the components of the cleaning solution, namely at least two components of the organic acid (A), the surfactant (B), the medium, and as a case requires, the surfactant (C), the anionic surfactant (D), the complexing agent (E) and other components are preliminarily contacted, and then the other components may be contacted, or all components may be contacted all at once.

However, from the viewpoint of the solubility, after the surfactant (C) is dissolved, the surfactant (B) is preferably contacted with the medium, or the surfactant (B) and the surfactant (C) are contacted with the medium at the same time, rather than the surfactant (B) alone.

Substrate to be Cleaned (Substrate for Semiconductor Device)

The cleaning solution of the present invention is used for cleaning the substrate surface of e.g. semiconductor, glass, metal, ceramics, resin, magnetic material or superconductor, where metal contaminants or particle contaminants will be problematic. Especially, it is suitably used for cleaning a substrate surface in production steps of a for a semiconductor device or a substrate for a display device where a high clean level of the substrate surface is required. Wirings or electrodes may exist on a surface of these substrates. As the material of the wiring or the electrodes, semiconductor material such as Si, Ge or GaAs; an insulating material such as $SiO_2$, silicon nitride, glass, a low dielectric constant (Low-k) material, aluminum oxide, a transition metal oxide (such as titanium oxide, tantalum oxide, hafnium oxide, zirconium oxide or the like), $(Ba, Sr)TiO_2$ (BST), a polyimide or an organic thermosetting resin; a metal such as W, Cu or Al, or an alloy thereof, silicide or nitride may be mentioned. Here, the Low-k material is a generic name of a material having a relative dielectric constant of at most 3.5, while silicon oxide such as TEOS has a dielectric constant of from 3.8 to 3.9. The Low-k material is mainly divided into three materials: an organic polymer material, an inorganic polymer (siloxane) material and a porous material. The organic polymer material may, for example, be polyimide, BCB (benzocyclobutene), Flare (tradename, manufactured by Honeywell International, Inc.), SiLK (tradename, manufactured by Dow Chemical Company), and the inorganic polymer material may, for example, be FSG (fluorinated silicate glass), BLACK DIAMOND (tradename, manufactured by Applied Materials, Inc.) or Aurora (tradename, manufactured by Japan ASM).

Whether electrodes or a wiring material is formed or not on a surface, the cleaning solution of the present invention can be preferably used for cleaning the surface of a substrate for a semiconductor device. Particularly, the cleaning solution of the present invention is preferably used for cleaning a substrate for a semiconductor device, which has an insulating film or the like on its surface and a water contact angle on the substrate surface of at least 60°.

If the contact angle is large at a time of cleaning substrates, a liquid such as a cleaning solution can be easily repelled, and metal contaminants, particle contaminants and composite contaminants of an organic matter and a metal cannot be sufficiently removed from the substrate surface. Therefore, the contact angle of the cleaning solution to a substrate is preferably at most 40°, more preferably at most 30°, further preferably at most 25°.

Method for Cleaning Substrate for Semiconductor Device

The method for cleaning a substrate for a semiconductor device is usually carried out by a method of directly contacting the cleaning solution with the substrate. The method of contacting the cleaning solution with the substrate may, for example, be a dipping method wherein a cleaning tank is filled with the cleaning solution and the substrate is dipped therein, a spinning method of rotating the substrate at a high speed while the cleaning solution is supplied on the substrate from a nozzle, or a spraying method of spraying the cleaning solution on the substrate for cleaning. An apparatus for carrying out such cleaning may, for example, be a batch system cleaning apparatus for cleaning a plurality of substrates accommodated in a cassette all at once or a sheet-fed system cleaning apparatus for cleaning one substrate fixed in a holder.

In the case of the batch cleaning apparatus, the cleaning time is usually at least 30 seconds, preferably at least 1 minute and usually at most 30 minutes, preferably at most 15 minutes. In a case of the sheet-fed type cleaning apparatus, the cleaning time is usually at least 1 second, preferably at least 5 seconds and usually at most 15 minutes, preferably at most 5 minutes. When the cleaning time is at least the above lower limit, the effect of cleaning is preferred, and when the cleaning time is at most the above upper limit, throughput tends not to be lowered. The cleaning solution of the present invention is applicable to any of the above methods, but is preferably used for spinning type or spraying type cleaning, since contaminants can be removed more effectively in a short time. As the type of the cleaning apparatus, the sheet-fed system cleaning apparatus is particularly preferably employed, since the cleaning time is shortened and the amount of the cleaning solution is reduced.

The cleaning temperature may be an optional temperature. The cleaning is usually carried out at room temperature, however, the cleaning may be carried out by heating the cleaning solution at a level of at least 40° C. and at most 70° C. in order to improve the cleaning effect. That is, the cleaning with the cleaning solution of the present invention can be usually carried out within a broad temperature range of at least 20° C. and at most 70° C.

Further, in a case where a substrate wherein silicon is exposed on a surface is cleaned, since organic contaminants tends to remain on the silicon surface, the substrate is subjected to a step of heating treatment at a temperature of at least 300° C. for thermal decomposition, or an organic matter is subjected to oxidation decomposition step with an ozone water.

Further, in the cleaning method of the present invention, a cleaning method by a physical force (physical cleaning) such as mechanical cleaning such as scrubbing cleaning by means of a cleaning brush, or ultrasonic cleaning may be used in combination. Particularly, in a case where ultrasonic irradiation or brush scrubbing is used in combination, the ability to remove particle contaminants can further be improved, whereby the cleaning time may be shortened, such being desirable.

When cleaning a chemically mechanically polished (CMP) substrate, a brush made of a resin is particularly preferably used. A material of the resin brush used for the brush cleaning is optional, however, for example, PVA (polyvinyl alcohol) is preferably used.

Further, if ultrasonic wave having a frequency of at least 0.5 MHz is applied on a substrate, the ability to remove particles is remarkably improved by the synergic effect with the surfactant.

Further, a cleaning with electrolyzed water obtained by electrolysis of water or hydrogenated water having hydrogen gas dissolved in water may be combined before and/or after the cleaning method of the present invention.

Process for Producing Substrate for Semiconductor Device

The cleaning solution of the present invention is preferably used for cleaning a substrate which has a wiring material on its surface for a semiconductor device. Specifically, the cleaning solution of the present invention is preferably used in a process for producing a substrate for a semiconductor device, which comprises a step of forming a wiring material layer and chemical mechanical polishing (CMP) its surface and after the CMP, a step of cleaning the wiring material layer by means of a cleaning solution which comprises the following components (A) and (B):

(A) an organic acid (B) a nonionic surfactant having an HLB value of from 5 to less than 13.

The material used for the wiring substrate may, for example, be a transition metal or a transition metal compound. Specifically, a transition metal such as W (tungsten), Cu (copper), Ti (titanium), Cr (chromium), Co (cobalt), Zr (zirconium), Hf (hafnium), Mo (molybdenum), Ru (ruthenium), Au (gold), Pt (platinum) or Ag (silver) and/or a transition metal compounds such as nitride, oxide or silicide of the above transition metals be mentioned. Among them, as an object to be cleaned by the cleaning method of the present invention, W (tungsten) and/or Cu (copper) is preferred, and Cu (copper) is particularly preferred.

The step of cleaning a substrate having such a wiring material on its surface may, for example, be cleaning of a substrate surface having a wiring material, an interlayer insulating film, etc. in a case where such a wiring material is used. Specifically, the cleaning solution of the present invention can be used at a cleaning step after forming a film of a wiring material on a semiconductor device, particularly a cleaning step after CMP (chemical mechanical polishing) a film of a wiring material or a cleaning step after forming a hole on an interlayer insulating film on wirings by dry etching.

If the film thickness of the wiring is changed at a time of cleaning the wiring, the resistance of the wiring or the like increases, properties deteriorate such that the wiring delay as a device results. Further, in a case where the wiring material is cleaned with the cleaning solution of the present invention, the rate of etching the wiring material on the substrate for a semiconductor device is preferably at most 10 nm/min, more preferably at most 8 nm/min, particularly preferably at most 5 nm/min, most preferably at most 1 nm/min.

Further, if particles remain on a substrate after cleaning, it becomes a latent factor for the change of the size of the wiring or the like, the change of the resistance or the change of the dielectric constant of the wiring or the insulating film at subsequent steps. Therefore, it is preferred to remove particles on the substrate after the cleaning. In a case where the cleaning is carried out with the cleaning solution of the present invention, at least 95% of particles can be removed, as the evaluation of "the cleaning property of particle contaminants" in the after-mentioned Examples.

In usual, the better the cleaning property of the cleaning solution is, the higher the etching rate of the wiring material on a substrate for a semiconductor device becomes. However, it is possible to clean a substrate for a semiconductor device with the cleaning solution of the present invention at a removability of particle contaminants of at least 95% and at a rate of etching of a wiring material on the substrate for a semiconductor device of at most 0.06 nm/min. Further, it is possible to clean a substrate for a semiconductor device preferably at a removability of particle contaminants of at least 95% and at a rate of etching of a wiring material on a substrate for a semiconductor device of at most 0.05 nm/min, particularly preferably the removability of particle contaminants of at least 95% and a rate of etching of a wiring material on a substrate for a semiconductor device of at most 0.04 nm/min.

EXAMPLES

Now, the present invention will be described in further detail with reference to Examples. However, the present invention is by no means restricted to the following Examples.

Further, the components (B) to (E) used as the structural constituents of the cleaning solution are described in further detail below. Further, the concentration of elements in a surfactant was analyzed by ICP-MS.

Surfactant (B): Surfactant (I) Represented by the Formula (I)

The mixture of a polyoxyethylene (b=4.5) lauryl ether and a polyoxyethylene (b=4.5) tridecyl ether (the contents of Na, Mg, Al, K, Ca, Fe, Cu, Pb and Zn are at most 10 ppm by weight respectively).

HLB value=10.2 (the average of 9.8, 9.4, 10.5 and 10.9)
(a)=12, 13
(b)=4.5
a/b=2.7, 2.9

Surfactant (B'): Surfactant (I') Represented by the Formula (I)

A polyoxyethylene (b=5.0) lauryl ether (the contents of Na, Mg, Al, K, Ca, Fe, Cu, Pb and Zn are at most 10 ppm by weight respectively).

HLB value=10.9
(a)=12
(b)=5.0
a/b=2.4

Surfactant (C): Surfactant (II) Represented by the Formula (II)

Polyoxyethylene (d=11) lauryl ether (the contents of Na, Mg, Al, K, Ca, Fe, Cu, Pb and Zn are at most 1 ppm by weight respectively).

HLB value=14.5
(c)=12
(d)=11
c/d=1.1

Anionic Surfactant (D)

Dodecylbenzene sulfonic acid (DBS) (the contents of Na, Mg, Al, K, Ca, Fe, Cu, Pb and Zn are at most 1 ppm by weight respectively).

Complexing Agent (E)

Glycine

Examples 1 to 13, Comparative Examples 1 and 2 and Reference Examples 1 to 4

A cleaning solution was prepared with the formulation shown in Table 1 (provided that the other part is water). Respective cleaning solutions were prepared by simultaneously adding respective components in water, followed by stirring to mix them. In the respective prepared cleaning solution, the contents of Na, Mg, Al, K, Ca, Fe, Cu, Pb and Zn were at most 5 ppb respectively, and the total amount of these respective contents was at most 10 ppb. pH of the prepared cleaning solution was measured by a pH meter (manufactured by Horiba, Ltd.). Further, water (as a medium for the cleaning solution and for cleaning) used in the present Examples was ultrapure water (the specific resistance was at least 18 MΩ) in all cases.

The following evaluations were carried out on the obtained cleaning solutions. Results are shown in Table 1. Further, in Comparative Examples 2 and 4, since it was evident by the visual observation that the surfactant (C) was not dissolved, the cleaning solutions were not evaluated.

Contact Angle to Substrate

A 50 mm×20 mm sample on which a Low-k film (SiOC: carbon-containing $SiO_2$) having a film thickness of 100 nm was laminated was cleaned with running water for 10 minutes, and then a predetermined amount of each cleaning solution was dropped thereon by means of a droplet adjusting apparatus to form droplets. The sample was left at a rest for 1 minute, and then the contact angle between the substrate and the droplets was measured by an image processing type contact angle tester ("CA-X150", manufactured by Kyowa Interface Science Co., Ltd.). Further, the contact angle to water obtained by this method was 75°.

Amount of Etched Copper

A copper foil film was immersed in each cleaning solution, and an amount of etched copper foil film was calculated from the change of the film thickness before and after the immersion by the following method.

A sample (20 mm×20 mm) wherein a copper layer having a film thickness of 150 nm was formed on a surface was washed with running water for 10 minutes. The test sample was immersed in a cleaning solution of which temperature was controlled at 23° C. for 2 hours. After the immersion, the sample was washed with running water for 5 minutes and dried by blowing nitrogen. The reflection intensity of one surface of the sample was measured by using total reflection X-ray fluorescence ("RIX-3000", manufactured by JEOL Ltd.), and a film thickness of the copper layer was calculated. Then, from the measurement of the film thickness before and after the cleaning treatment, the rate of etching was calculated as the amount of etched copper.

Ability to Clean Particle Contamination

A silicon substrate provided with a low-k film was immersed in a $SiO_2$ slurry solution to stain a surface with particles, and then the substrate was immersed in each cleaning solution. From the change of the number of particles before and after the immersion, the ability to clean particle contaminants was evaluated as follows.

A 8 inch silicon substrate provided with a Low-k film (SiOC: carbon-containing $SiO_2$) was immersed in a $SiO_2$ slurry solution for 10 minutes. After the immersion, the substrate was washed with water for 1 minute, and the substrate was subjected to spin drying by means of a multispinner ("KSSP-201", manufactured by Kaijo Corporation). Then, the number of particles attached on the substrate surface was measured by a laser surface inspection device ("LS-6600", manufactured by Hitachi Electronics Engineering Co., Ltd.), and it was confirmed that from 4,000 to 7,000 particles which were at least 0.2 μm were attached.

The substrate with $SiO_2$ slurry was subjected to brush scrubbing cleaning by means of a multispinner ("KSSP-201", manufactured by Kaijo Corporation) using each cleaning solution to remove particles on the substrate surface. The cleaning was carried out by using a brush made of a polyvinyl alcohol, and while rotating the substrate at 600 rpm, the cleaning solution was supplied at 1 liter/min at room temperature for 30 seconds. The substrate after the cleaning was washed with running water for 30 seconds, and the substrate was subjected to spin drying for 20 seconds, while rotating at 3,000 rpm. By means of the laser surface inspection device ("LS-6600", manufactured by Hitachi Electronics Engineering Co., Ltd.), the number of particles which were at least 0.2 μm and remained on the substrate surface were measured, and the cleaning percentage (%) by cleaning was calculated to evaluate the cleaning property.

TABLE 1

| | Organic acid (A) | | | | Surfactant | | | | | |
| | | | | | Low HLB nonionic type (B) | | Low HLB nonionic type (C) | | Nonionic type (total) HLB | |
| | Type | wt % | Type | wt % | HLB | wt % | HLB | wt % | average | wt % |
|---|---|---|---|---|---|---|---|---|---|---|
| Ex. 1 | Citric acid | 0.38 | — | | 10.2 | 0.0500 | 14.5 | 0.0190 | 11.4 | 0.0690 |
| Ex. 2 | Citric acid | 0.38 | | | 10.2 | 0.0500 | 14.5 | 0.0190 | 11.4 | 0.0690 |
| Ex. 3 | Citric acid | 0.38 | Malonic acid | 0.05 | 10.2 | 0.0500 | 14.5 | 0.0190 | 11.4 | 0.0690 |
| Ex. 4 | Citric acid | 0.38 | Malonic acid | 0.2 | 10.2 | 0.0500 | 14.5 | 0.0190 | 11.4 | 0.0690 |
| Ex. 5 | Citric acid | 0.38 | Succinic acid | 0.1 | 10.2 | 0.0500 | 14.5 | 0.0190 | 11.4 | 0.0690 |
| Ex. 6 | Citric acid | 0.38 | Glutaric acid | 0.1 | 10.2 | 0.0500 | 14.5 | 0.0190 | 11.4 | 0.0690 |
| Ex. 7 | Citric acid | 0.38 | | — | 10.2 | 0.0500 | 14.5 | 0.0190 | 11.4 | 0.0690 |
| Ex. 8 | Citric acid | 0.38 | | — | 10.2 | 0.0250 | 14.5 | 0.0060 | 11.0 | 0.0310 |
| Ex. 9 | Citric acid | 0.38 | | — | 10.2 | 0.0250 | 14.5 | 0.0125 | 11.6 | 0.0375 |
| Ex. 10 | Citric acid | 0.38 | | — | 10.2 | 0.0500 | 14.5 | 0.0125 | 11.1 | 0.0625 |
| Ex. 11 | Citric acid | 0.38 | | — | 10.2 | 0.0250 | 14.5 | 0.0190 | 12.1 | 0.0440 |
| Ex. 12 | Citric acid | 0.38 | | — | 10.2 | 0.0750 | 14.5 | 0.0190 | 11.1 | 0.0940 |
| Ex. 13 | Citric acid | 0.38 | Malonic acid | 0.2 | 10.2 | 0.0500 | 14.5 | 0.0190 | 11.4 | 0.0690 |
| Comp. Ex. 1 | Citric acid | 0.38 | | — | | 0.0000 | 14.5 | 0.0190 | 14.5 | 0.0190 |
| Ref. Ex. 1 | Citric acid | 0.38 | | — | 10.2 | 0.0250 | | 0.0000 | | 0.0000 |
| Comp. Ex. 2 | Citric acid | 0.38 | | — | | 0.0000 | | 0.0000 | | 0.0000 |
| Ref. Ex. 2 | Citric acid | 0.38 | | — | 10.2 | 0.0250 | | 0.0000 | | 0.0000 |
| Ref. Ex. 3 | Citric acid | 0.38 | | — | 10.9 | 0.0690 | | 0.0000 | 10.9 | 0.0690 |
| Ref. Ex. 4 | Citric acid | 0.38 | | — | 10.9 | 0.0690 | | 0.0000 | 10.9 | 0.0690 |

| | surfactant Anion type (D) | | surfactant total | Complexing agent | | Contact angle | Etched amount | Cleaning property | |
| | Type | wt % | wt % | wt % | pH | (θ) | (nm/min) | (%) | Others |
|---|---|---|---|---|---|---|---|---|---|
| Ex. 1 | DBS | 0.0000 | 0.0690 | 0.0000 | 2.5 | 13 | 0.04 | 97 | |
| Ex. 2 | DBS | 0.0125 | 0.0815 | 0.0000 | 2.3 | 14 | 0.03 | 99 | |
| Ex. 3 | DBS | 0.0125 | 0.0815 | 0.0000 | 2.2 | 14 | 0.04 | | |
| Ex. 4 | DBS | 0.0125 | 0.0815 | 0.0000 | 2.1 | 14 | 0.02 | 99 | |
| Ex. 5 | DBS | 0.0125 | 0.0815 | 0.0000 | 2.2 | 13 | 0.03 | | |
| Ex. 6 | DBS | 0.0125 | 0.0815 | 0.0000 | 2.2 | 14 | 0.04 | | |
| Ex. 7 | DBS | 0.0125 | 0.0815 | 0.0250 | 2.5 | 14 | 0.03 | | |
| Ex. 8 | DBS | 0.0125 | 0.0435 | 0.0000 | 2.3 | 17 | | | |
| Ex. 9 | DBS | 0.0125 | 0.0500 | 0.0000 | 2.4 | 16 | | | |
| Ex. 10 | DBS | 0.0125 | 0.0750 | 0.0000 | 2.3 | 14 | | | |
| Ex. 11 | DBS | 0.0125 | 0.0565 | 0.0000 | 2.3 | 14 | | | |
| Ex. 12 | DBS | 0.0125 | 0.1065 | 0.0000 | 2.3 | 14 | | | |
| Ex. 13 | DBS | 0.0000 | 0.0690 | 0.0000 | 2.2 | 17 | | 96 | |
| Comp. Ex. 1 | DBS | 0.0000 | 0.0190 | 0.0000 | 2.5 | 35 | | | |
| Ref. Ex. 1 | | 0.0000 | 0.0250 | 0.0000 | 2.5 | — | — | — | Did not dissolve |
| Comp. Ex. 2 | DBS | 0.0125 | 0.0125 | 0.0000 | 2.3 | 62 | 0.09 | 89 | |
| Ref. Ex. 2 | DBS | 0.0125 | 0.0375 | 0.0000 | 2.3 | — | — | — | Did not dissolve |
| Ref. Ex. 3 | | 0.0000 | 0.0690 | 0.0000 | 2.6 | — | — | — | Did not dissolve |
| Ref. Ex. 4 | DBS | 0.0125 | 0.0815 | 0.0000 | 2.3 | — | — | — | Did not dissolve |

From the above results, it is evident that the contact angle of the cleaning solution of the present invention to hydrophobic dielectric constant (Low-k) films is remarkably low, the cleaning solution of the present invention has an excellent wettability, and the amount of etching wiring materials can be reduced. Further, even if fine particles (particles) or the like are contaminated in the system, by cleaning the substrate with the cleaning solution of the present invention, the substrate can be cleaned highly and prevented from reattaching, and the cleaning property to hydrophobic substrates and low etching property can be both established by the cleaning solution of the present invention.

INDUSTRIAL APPLICABILITY

The cleaning solution of the present invention can be used for removing fine particles (particles), organic contaminants, metal contaminants and composite contaminants of an organic matter and a metal attached on a substrate surface and prevents reattaching, whereby the substrate surface can be highly cleaned without damaging or corroding the substrate surface in semiconductor materials such as silicon, insulating materials such as silicon nitride, silicon oxide, glass or low dielectric constant (Low-k) material or a substrate for a semiconductor device having a transition metal or a transition metal compound on a part of or the entire of its surface.

The entire disclosure of Japanese Patent Application No. 2007-133083 filed on May 18, 2007 including specification, claims, drawings and summary is incorporated herein by reference in its entirety.

The invention claimed is:

1. A cleaning solution for a substrate of a semiconductor device, which comprises the following components (A), (B) and (C):
   (A) an organic acid,
   (B) a nonionic surfactant having an HLB value of from 5 to less than 13; and (C) a nonionic surfactant having an HLB value of from 13 to 20.

2. The cleaning solution for a substrate of a semiconductor device according to claim 1, wherein the content of the component (B) is from 0.0005 to 5 wt %.

3. The cleaning solution for a substrate of a semiconductor device according to claim 1, wherein the relative content (weight ratio) of the component (B) to the component (C) is component (B): component (C)=1:1 to 10:1.

4. The cleaning solution for a substrate of a semiconductor device according to claim 1, which further contains a component (D): an anionic surfactant other than the component (C).

5. The cleaning solution for a substrate of a semiconductor device according to claim 1, wherein the organic acid (A) is a polycarboxylic acid.

6. The cleaning solution for a substrate of a semiconductor device according to claim 1, which has a pH of from 1 to 5.

7. The cleaning solution for a substrate of a semiconductor device according to claim 1, which further contains a component (E): a complexing agent.

8. A method for cleaning a substrate of a semiconductor device, which comprises cleaning a substrate of a semiconductor device by means of the cleaning solution as defined in claim 1.

9. The cleaning solution for a substrate of a semiconductor device as defined in claim 1, which has an etching rate of a wiring material on the substrate of a semiconductor device of at most 0.06 nm/minute and a removing efficiency of particle contaminants of at least 95%.

10. The cleaning solution for a substrate of a semiconductor device according to claim 9, wherein the wiring material on the substrate of a semiconductor device is copper.

11. A method for cleaning a substrate of a semiconductor device, which comprises cleaning a substrate of a semiconductor device which has a wiring material on its surface by means of the solution as defined in claim 9.

12. A process for producing a substrate of a semiconductor device, which comprises forming a wiring material layer on said substrate and chemical mechanical polishing (CMP) its surface, and cleaning the wiring material layer after the CMP by means of a cleaning solution which comprises the following components (A), (B) and (C):

(A) an organic acid,
(B) a nonionic surfactant having an HLB value of from 5 to less than 13; and
(C) a nonionic surfactant having an HLB value of from 13 to 20.

* * * * *